US009576682B2

(12) United States Patent
Chinnakkonda Vidyapoornachary et al.

(10) Patent No.: US 9,576,682 B2
(45) Date of Patent: Feb. 21, 2017

(54) TRAFFIC AND TEMPERATURE BASED MEMORY TESTING

(71) Applicant: International Business Machines Corporation, Armonk, NY (US)

(72) Inventors: Diyanesh B. Chinnakkonda Vidyapoornachary, Bangalore (IN); Timothy J. Dell, Colchester, VT (US); Joab D. Henderson, Pflugerville, TX (US); Anil B. Lingambudi, Bangalore (IN); Michael D. Pardeik, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 14/220,924

(22) Filed: Mar. 20, 2014

(65) Prior Publication Data

US 2015/0270017 A1    Sep. 24, 2015

(51) Int. Cl.
| | | |
|---|---|---|
| *G11C 29/50* | (2006.01) | |
| *G11C 29/06* | (2006.01) | |
| *G11C 5/04* | (2006.01) | |
| *G11C 7/04* | (2006.01) | |

(52) U.S. Cl.
CPC ............. *G11C 29/50* (2013.01); *G11C 29/06* (2013.01); *G11C 29/50004* (2013.01); *G11C 5/04* (2013.01); *G11C 7/04* (2013.01); *G11C 2029/5002* (2013.01)

(58) Field of Classification Search
None
See application file for complete search history.

(56) References Cited

U.S. PATENT DOCUMENTS

| | | | |
|---|---|---|---|
| 6,357,022 B1 * | 3/2002 | Nguyen | ................ G01R 31/01 714/42 |
| 7,473,568 B2 | 1/2009 | Co et al. | |
| 7,496,817 B2 | 2/2009 | Liu et al. | |
| 7,830,690 B2 | 11/2010 | Santos et al. | |
| 7,917,328 B2 | 3/2011 | Casey et al. | |

(Continued)

OTHER PUBLICATIONS

Chinnakkonda Vidyapoornachary et al., "Traffic and Temperature Based Memory Testing", U.S. Appl. No. 14/584,372, filed Dec. 29, 2014.

*Primary Examiner* — Melissa Koval
*Assistant Examiner* — Felicia Farrow
(74) *Attorney, Agent, or Firm* — Daniel C. Housley

(57) ABSTRACT

The method may include accessing, with a first stress test, a plurality of memory modules, the plurality of memory modules coupled in a computer system, the plurality of memory modules including a first module having a first memory characteristic and a second module having a second memory characteristic. The method may include determining for the first module, a first traffic-to-temperature parameter, and determining that the first module was sufficiently stressed in response to determining that the first traffic-to-temperature parameter is within a first traffic-to-temperature range. The method may also include determining, for the second module, a second traffic-to-temperature parameter, and determining that the second module was sufficiently stressed in response to determining that the second traffic-to-temperature parameter is within a second traffic-to-temperature range.

12 Claims, 3 Drawing Sheets

(56) References Cited

U.S. PATENT DOCUMENTS

| | | |
|---|---|---|
| 8,301,941 B2 | 10/2012 | Bodrozic et al. |
| 8,359,501 B1 * | 1/2013 | Lee .................. G11C 29/12 |
| | | 714/718 |
| 8,418,005 B2 | 4/2013 | Depew et al. |
| 8,468,408 B2 | 6/2013 | Chen et al. |
| 9,046,424 B2 * | 6/2015 | Hsu .................. G06F 1/206 |
| 2004/0008353 A1 * | 1/2004 | Chu .................. G03F 7/70625 |
| | | 356/636 |
| 2004/0008553 A1 | 1/2004 | Pekny |
| 2006/0218455 A1 | 9/2006 | LeClair et al. |
| 2008/0297188 A1 * | 12/2008 | Aubel .............. G01R 31/2858 |
| | | 324/750.01 |
| 2009/0285044 A1 * | 11/2009 | Chen .................. G11C 29/50 |
| | | 365/201 |
| 2009/0296465 A1 * | 12/2009 | Wang .............. G11C 16/3454 |
| | | 365/185.2 |
| 2010/0180089 A1 | 7/2010 | Flemming et al. |
| 2010/0180154 A1 | 7/2010 | Bellows |
| 2011/0316573 A1 * | 12/2011 | Chen .............. G01R 31/2808 |
| | | 324/754.07 |
| 2012/0210156 A1 | 8/2012 | Allen-Ware et al. |
| 2013/0054179 A1 * | 2/2013 | Shapira .............. G06F 11/3058 |
| | | 702/117 |

* cited by examiner

TRAFFIC AND TEMPERATURE BASED MEMORY TESTING

BACKGROUND

The present disclosure relates to memory module testing, more particular aspects relate to stress testing memory modules to determine traffic-to-temperature parameters. Stress testing may generally be understood as deliberately intense or thorough testing used to determine the stability of a given system or hardware. It may generally involve observing the performance of hardware or a computer system when operated in a manner beyond normal operational capacity. Determining stability through stress testing however may take time and may affect performance of the system or hardware during testing. Therefore, it may prove advantageous to efficiently test hardware and systems in order to reduce testing time and the performance effects while testing.

SUMMARY

According to embodiments of the present disclosure, a method of memory module testing may include accessing, with a first stress test, a plurality of memory modules, the plurality of memory modules coupled in a computer system, the plurality of memory modules including a first module having a first memory characteristic and a second module having a second memory characteristic. The method may include determining for the first module, a first traffic-to-temperature parameter, and determining that the first module was sufficiently stressed in response to determining that the first traffic-to-temperature parameter is within a first traffic-to-temperature range. The method may include determining, for the second module, a second traffic-to-temperature parameter, and determining that the second module was sufficiently stressed in response to determining that the second traffic-to-temperature parameter is within a second traffic-to-temperature range.

The method may further include accessing the first memory module with a second stress test in response to determining that the first traffic-to-temperature parameter is outside the first traffic-to-temperature range. The method may include determining a third traffic-to-temperature parameter for the first module, and determining that the third traffic-to-temperature parameter is within the first traffic-to-temperature range. The first stress test may provide a first level of traffic received at the plurality of memory modules and the second stress test provides a second level of traffic received at the first module. The second level of traffic may be greater than the first level of traffic.

The method may further include accessing the second memory module with a second stress test in response to determining that the second traffic-to-temperature parameter is outside the second traffic-to-temperature range. The method may include determining a fourth traffic-to-temperature parameter for the second module, and determining that the fourth traffic-to-temperature parameter is within the second traffic-to-temperature range. The first stress test may provide a first level of traffic received at the plurality of memory modules and the second stress test provides a second level of traffic received at the second module. The second level of traffic may be greater than the first level of traffic.

The first memory characteristic may be a single-drop module and the second memory characteristic may be a dual-drop module. The first memory characteristic may be a first capacity module and the second memory characteristic may be a second capacity, the first capacity greater than the second capacity. The first traffic-to-temperature range may be based on the first capacity and the second traffic-to-temperature range may be based on the second capacity.

A system for verifying memory module functionality may include a plurality of memory modules coupled together, the plurality of memory modules including a first module having a first memory characteristic and a second module having a second memory characteristic. The system may include a memory controller, the memory controller configured to initiate a first stress test to the first and second modules. The system may also include a logic device, the logic device configured to measure a first traffic-to-temperature parameter for the first module and a second traffic-to-temperature parameter for the second module. The logic device may be configured to determine that the first module was sufficiently stressed in response to determining that that the first traffic-to-temperature parameter is within a first traffic-to-temperature range. The logic device may also be configured to determine that the second module was sufficiently stressed in response to determining that the second traffic-to-temperature parameter is within a second traffic-to-temperature range.

The memory controller may be configured to initiate a second stress test to the first module in response to the logic device determining that the first traffic-to-temperature parameter is outside the first traffic-to-temperature range. The logic device may be configured to determine a third traffic-to-temperature parameter for the first module, and determining that the first module is sufficiently stressed in response to determining that a third traffic-to-temperature parameter is within the first traffic-to-temperature range. The first stress test may provide a first level of traffic received at the plurality of memory modules and the second stress test may provide a second level of traffic received at the first module, the second level of traffic greater than the first level of traffic. The memory controller may be configured to initiate a second stress test to the second module in response to the logic device determining that the second traffic-to-temperature parameter is outside the second traffic-to-temperature range. The logic device may also be configured to determine a fourth traffic-to-temperature parameter for the second module, and determine that the second module is sufficiently stressed in response to determining that the fourth traffic-to-temperature parameter is within the second traffic-to-temperature range.

The first stress test may provide a first level of traffic received at the plurality of memory modules and the second stress test may provide a second level of traffic received at the second module. The second level of traffic may be greater than the first level of traffic. The first memory characteristic may be a single-drop module and the second memory characteristic is a dual-drop module. The first memory characteristic may be a first capacity module and the second memory characteristic may be a second capacity, the first capacity may be greater than the second capacity. The first traffic-to-temperature range may be based on the first capacity and the second traffic-to-temperature range may be based on the second capacity.

A computer program product for memory module testing, the computer program product comprising a computer readable storage medium having program instructions embodied therewith, the program instructions executable by a computer to cause the computer to perform a method may include accessing, with a first stress test, a plurality of memory modules, the plurality of memory modules coupled in a computer system. The plurality of memory modules may include a first module having a first memory characteristic and a second module having a second memory characteristic. The computer program product may include determining for the first module, a first traffic-to-temperature parameter, and determining that the first module was sufficiently stressed in response to determining that the first traffic-to-temperature parameter is within a first traffic-to-temperature range. The computer program product may include determining, for the second module, a second traffic-to-temperature parameter, and determining that the second module was sufficiently stressed in response to determining that the second traffic-to-temperature parameter is within a second traffic-to-temperature range.

The computer program product may further include accessing the first memory module with a second stress test in response to determining that the first traffic-to-temperature parameter is outside the first traffic-to-temperature range. The computer program product may include determining a third traffic-to-temperature parameter for the first module, and determining that the first module is sufficiently stressed in response to determining that the third traffic-to-temperature parameter is within the first traffic-to-temperature range. The first stress test may provide a first level of traffic received at the plurality of memory modules and the second stress test may provide a second level of traffic received at the first module, the second level of traffic greater than the first level of traffic.

The computer program product may further include accessing the second memory module with a second stress test in response to determining that the second traffic-to-temperature parameter is outside the second traffic-to-temperature range and determining a fourth traffic-to-temperature parameter for the second module, and determining that the second module is sufficiently stressed in response to determining that the fourth traffic-to-temperature parameter is within the second traffic-to-temperature range. The first stress test may provide a first level of traffic received at the plurality of memory modules and the second stress test may provide a second level of traffic received at the second module, the second level of traffic greater than the first level of traffic. The first memory characteristic may be a first capacity module and the second memory characteristic may be a second capacity, the first capacity greater than the second capacity.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
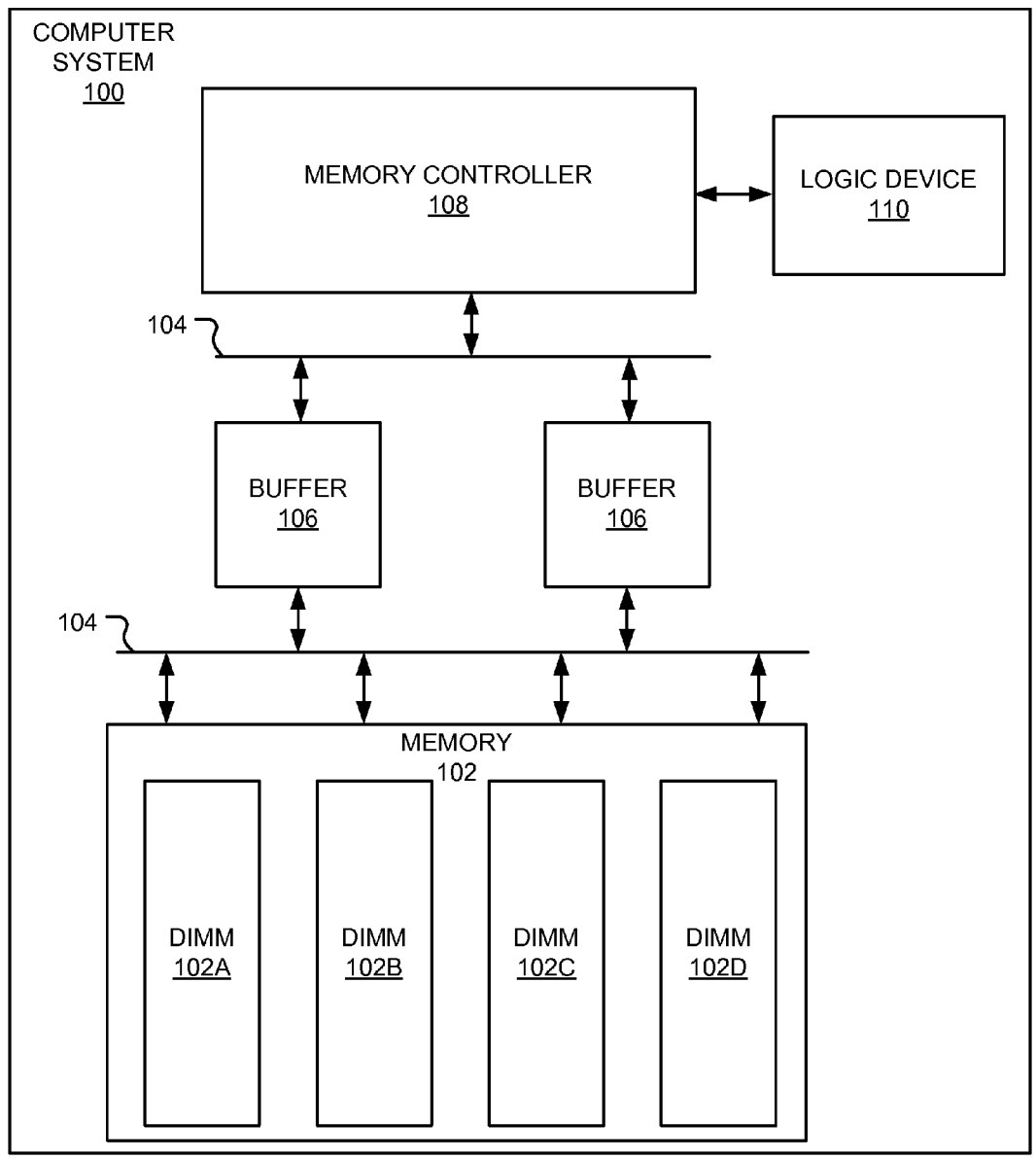
FIG. 1 depicts a computer system for memory module testing according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to memory module testing, more particular aspects relate to stress testing memory modules to determine traffic-to-temperature parameters. While the present disclosure is not necessarily limited to such applications, various aspects of the disclosure may be appreciated through a discussion of various examples using this context.

Stress testing may generally be understood as deliberately intense or thorough testing used to determine the stability of a given system or hardware. It may generally involve observing the performance of hardware or a computer system when operated in a manner beyond normal operational capacity. Stress testing may be performed for various reasons including, but not limited to, determining safe usage limits, confirming intended specifications are being met, determining modes of failure (how exactly a system may fail), and testing the stability of hardware or computer system when operated under particular conditions. The testing process may involve observing hardware while operating under particular workloads, memory use, thermal loads, clock speeds, or voltages. Hardware such as computer memory may be tested in this way.

As an example of memory stress testing, operating system (OS) driven test tools may be used to stress a plurality of memory modules. These tools may operate over OS real address space, controlling stress at physical ranks of memory modules. The OS tools may exercise memory with a pre-determined number of READ & WRITE commands (traffic) to the plurality of memory modules. Traffic at each module over the test period time may be monitored to determine the performance characteristics of the plurality of memory modules under testing conditions.

In various environments, it may be advantageous to verify a desired level of hardware performance in order to increase the likelihood of preemptively identifying and replacing components which may be defective or do not otherwise operate at a desired level of performance. Therefore, computer hardware may generally undergo various types of stress testing in order to verify operation at the desired level of performance. Stress testing however, takes time and may reduce overall performance of the computer system while hardware or the computer system is being tested. Further, in order to receive accurate testing results, testing time and computer system performance effects may depend upon the hardware being tested and the configuration of the hardware in the computer system. This may be especially true in the case of computer memory stress testing.

Computer systems having memory may apply various types and configurations of memory modules within a computer system. Various configurations of memory modules may enable the computer memory subsystem to be configured for a broad range of computer memory needs. Memory configurations may include a mixed capacity configuration, where the computer system has a plurality of memory modules having varying capacity between the memory modules. Memory configurations may also include a mixed channel configuration, where the computer system has a plurality of memory modules including a memory module in single-drop configuration (one memory module per memory channel) and a memory module in dual-drop configuration (two memory modules per memory channel).

Stress testing duration and computer system performance effects may depend upon the configuration of memory modules in the computer system. For example, mixed capacity configurations and mixed channel configurations may increase the time and performance effects for properly and accurately testing a plurality of memory modules. For example, in both mixed capacity and mixed channel configurations, ensuring uniform traffic on all memory modules may be difficult. In the example of mixed capacity testing, it may be unknown whether each module received sufficient stress to verify that the module performs at the desired level of performance. The stress test may present sufficient stress on one particular load, while at the same time one or more other memory modules may not undergo the same level of stress. In one example, the uneven distribution of stress may be due to the modules with greater capacity receiving more traffic than modules with lesser capacity. This may increase total stress test duration as individual configurations of memory modules may need to be tested separately rather than testing all of the plurality of memory modules together. The same issue may present in mixed channel configuration testing. Testing may also reduce computer system performance. Stress testing of a certain portion of memory may locks up memory bandwidth and capacity, which may result in performance loss. Therefore, it may prove advantageous to improve stress test accuracy and efficiency, in order to reduce potential test escapes and or hardware failures.

A method of memory module testing may include accessing, with a first stress test, a plurality of memory modules. The plurality of memory modules may be coupled in a computer system and may include a first module having a first memory characteristic and a second module having a second memory characteristic. The method may include determining, for the first module, a first traffic-to-temperature parameter, and determining that the first module is sufficiently stressed in response to determining that the first traffic-to-temperature parameter is within a first traffic-to-temperature range. The method may also include determining, for the second module, a second traffic-to-temperature parameter, and determining that the second module is sufficiently stressed in response to determining that the second traffic-to-temperature parameter is within a second traffic-to-temperature range.

Referring now to FIG. 1, a computer system 100 according to an embodiment may be seen. The computer system may include a plurality of memory modules 102. The plurality of memory modules 102 may be connected to buffers 106. The plurality of memory modules may be connected, via a memory bus 104, to the buffers 106 and to a memory controller 108. The memory controller 108 may be connected to a logic device 110.

The plurality of memory modules 102 may provide the computer system 100 with volatile real memory. The plurality of memory modules 102 may be constructed as cards containing memory chips such as DRAM, SRAM chips, flash memory, DIMMs (dual inline memory modules), or other suitable unit of memory. In FIG. 1, an embodiment may be seen where the plurality of memory modules 102 are constructed as DIMMs 102A, 102B, 102C, 102D, however other types of suitable memory may be used in lieu of DIMMs. Various amounts of memory in the plurality of memory modules 102 may be used.

The plurality of memory modules 102 may provide a physical location for data to be stored in the computer system 100. The plurality of memory modules 102 may contain various kinds of data such as an operating system, instructions, control programs, or other data. The plurality of memory modules 102 may include a first module having a first memory characteristic and a second module having a second memory characteristic. The first and second memory characteristics may be chosen as any suitable characteristic for computer memory. For example, the first and second memory characteristic may include capacity, memory type, memory protocol, single-drop configuration, and dual drop configuration, or other suitable memory characteristic.

In an embodiment, the first module has a first memory characteristic of being a single-drop module and the second module has a second memory characteristic of being a dual-drop module. In another embodiment, the first module has a first memory characteristic of being a first capacity module and the second module has a second memory characteristic of being a second capacity. In an embodiment the first capacity may be greater than the second capacity. For example, the first capacity may be 32 gigabytes (GB) and the second capacity may be 16 GB.

The dedicated buffers 106 may provide various functions including providing a region of a physical storage used to temporarily store data while it is transmitted to and from the plurality of memory portions 102, verifying channel connectivity, synchronizing memory modules, detecting errors, providing logic for the plurality of real memory portions, and other functions. The dedicated buffers 106 may be implemented in a fixed memory location in hardware. In an embodiment, the dedicated buffers 106 may be located on a memory chip with one or more of the plurality of real memory portions 102. The dedicated buffers 106 may also be implemented by using a virtual data buffer in software, which may point to a location in physical memory.

The memory bus 104 may allow for data to be transferred between the plurality of memory modules 102 through the buffers 106 to the memory controller 108. The memory bus 104 may be constructed as various types of buses, including parallel bus, serial bus, or other type of bus. The memory bus 104 may allow for peer to peer transfer of data, master/slave transfer of data, or other type of connection.

The memory controller 108 may perform various functions within the computer system 100. For example, the memory controller 108 may execute READ and WRITE operations at the plurality of memory modules 102. The memory controller 108 may also be implemented as hardware, software, or a combination of the two. The memory controller 108 may be coupled to the plurality of memory modules 102 by the memory bus 104. The memory controller 108 may contain and execute logic or instructions.

The memory controller 108 may execute stress tests. The stress test may initiate a level of traffic at the plurality of memory modules 102. The stress test may exercise memory with a pre-determined number of READ & WRITE commands (traffic) to the plurality of memory modules over a predetermined duration. The memory controller 108 may control the level of traffic initiated by the stress test. In an embodiment, the memory controller 108 may initiate a first stress test which initiates a first level of traffic and a second stress test which initiates a second level of traffic. The first and second levels of traffic may be different. In an embodiment, the second level of traffic is greater than the first level of traffic. However, other methods of stress testing may be used by the memory controller 108, including increasing memory clock speeds, increasing voltage to the memory or other suitable stress test.

Logic device 110 may provide software, hardware, and firmware to support one or more processing operations on the computer system 100. This may include software such as operating systems and applications such as a stress testing application. The logic device 110 may include hardware such as microprocessors, microcontrollers, field programmable gate arrays, application specific integrated circuits and firmware to include executable code to initiate BIOS and initiate computer system 100 elements for virtualization operations. The logic device 110 may communicate with the memory controller 108. In an embodiment, the logic device may instruct the memory controller 108 to perform a stress test using the plurality of memory modules 102.

The logic device 110 may be configured to monitor memory traffic versus associated temperature levels simultaneously for each memory module 102A, 102B, 102C, 102D during the course of a test period. The memory traffic verses associated temperature levels for each module may be referred to as a traffic-to-temperature parameter. In an embodiment, the first module may have a first traffic-to-temperature parameter and the second module may have a second traffic-to-temperature parameter. Once the stress test is started, the logic device may monitor the plurality of memory modules and keep track of traffic-to-temperature parameters.

The logic device 110 may also be configured to determine a traffic-to-temperature range for each of the plurality of memory modules 102. The traffic-to-temperature range may be a range of values between an upper limit and a lower limit which indicate desired performance characteristics for a memory module. The traffic-to-temperature range may include an upper traffic limit and lower traffic limit and an upper temperature limit and a lower temperature limit. The traffic-to-temperature range may be specific to each of the plurality of memory modules. In an embodiment, the plurality of memory modules may have a first module and a second module. The first module may have a first traffic-to-temperature range and the second module may have a second traffic-to-temperature range where the first and second traffic-to-temperature ranges are not the same.

The traffic-to-temperature range may depend upon the memory characteristics of the plurality of memory modules 102. In an embodiment, the first module may have a first memory characteristic and the second module may have a second memory characteristic. The first memory characteristic first may be a first capacity and the second memory characteristic may be a second capacity. The first traffic-to-temperature range may be based on the first capacity and the second traffic-to-temperature range may be based on the second capacity.

For each of the plurality of memory modules that have the traffic-to-temperature parameter within their traffic-to-temperature range, the logic device may determine that the memory module functions at the desired level of performance. Memory modules which have the traffic-to-temperature parameter outside the traffic-to-temperature range may indicate that the modules did not receive sufficient traffic to verify that the module operates at the desired level of performance. The memory modules outside of the traffic-to-temperature range may need a different test configuration to generate sufficient stress on those modules. In an embodiment, each of the plurality of memory modules which have the traffic-to-temperature parameter outside of the traffic-to-temperature range the logic device may then initiate a second stress test. The second stress test may generate a second level of traffic to one or more of the plurality of memory modules being tested. The second level of traffic may be greater then, less than, or the same as the first level of traffic.

FIG. 1 depicts a representative of certain major components of the computer system 100. Individual components, however, may have additional detail not represented in FIG. 1 for ease of understanding and not necessary to understand the embodiment shown. Components other than or in addition to those shown in FIG. 1 may be present, and the number, type, and configuration of such components may vary. Several particular examples of additional detail or additional variations are disclosed herein. These examples are by way of example only and are not necessarily the only such variations. The various program components illustrated in FIG. 1 may be implemented, in various embodiments, in a number of different manners, including using various computer applications, routines, components, programs, objects, modules, data structures, etc., which may be referred to herein as software, computer programs, or simply programs.

Figure 2:
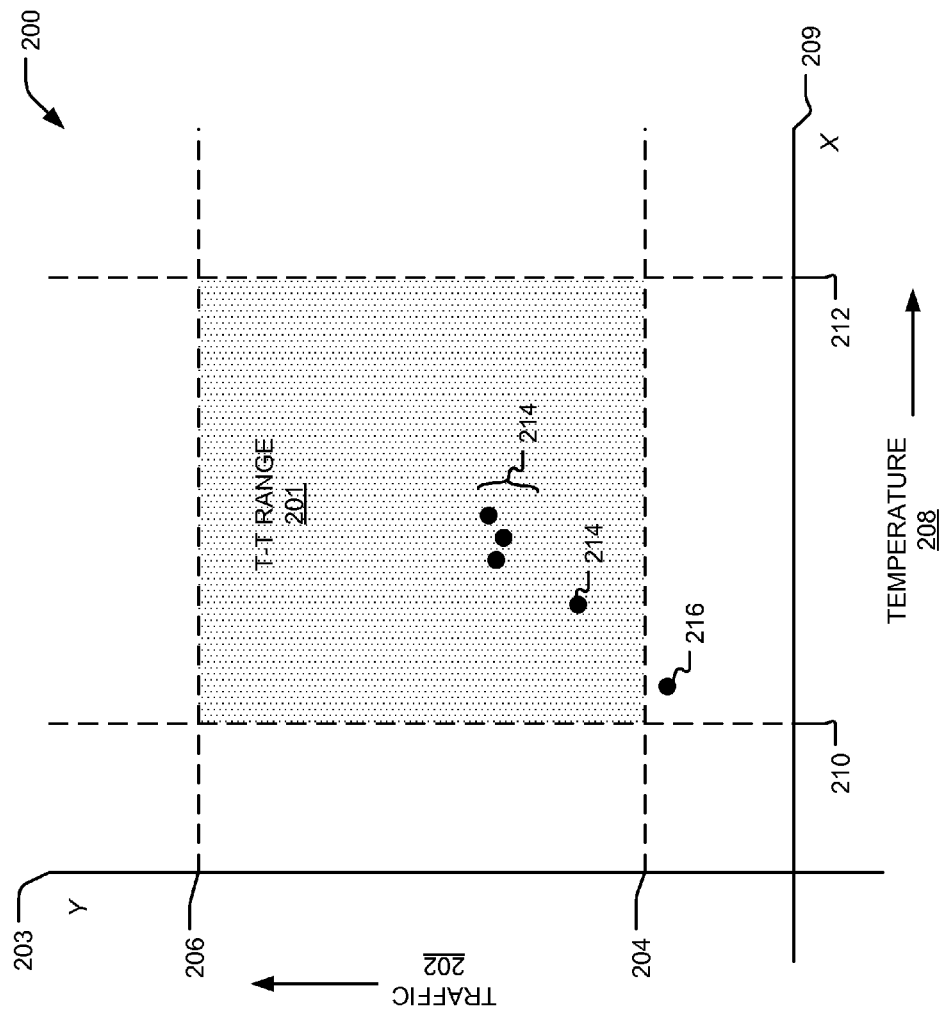
FIG. 2 depicts a graphical representation of a traffic-to-temperature range and data points according to an embodiment.

Referring now to FIG. 2, a traffic-to-temperature graph 200 may be seen according to an embodiment. The traffic-to-temperature graph 200 may be a graphical representation of the traffic-to-temperature range 201 for a particular module in a plurality of memory modules. As described above, the traffic-to-temperature range 201 may be a range of values between an upper limit and a lower limit which indicate desired performance characteristics for a memory module. The traffic-to-temperature range 201 may be dependant upon memory characteristics of each individual module. Thus, the traffic-to-temperature range 201 may represent one or more modules sharing the same memory characteristics in the plurality of memory modules 102 (FIG. 1). During a stress test, if the module has a traffic-to-temperature parameter within the traffic-to-temperature range 201, the module may be determined to operate at a desired level of performance. If the module has traffic-to-temperature parameter outside the traffic-to-temperature range 201 it may indicate that the module did not receive sufficient traffic or that the module does not operate at the desired level of performance.

In the temperature to channel traffic graph 200, the y-axis 203 may represent traffic 202. The arrow on the graph indicates the direction on the y-axis 203 which indicates increasing traffic 202. Lower traffic line 204 and upper traffic line 206 may be plotted on the graph 200. The lower traffic line 204 may indicate a lower limit in the traffic-to-temperature range 201. The upper traffic line 206 may indicate an upper limit in the traffic-to-temperature range 201

The x-axis 209 may represent temperature 208. The arrow on the graph indicates the direction on the x-axis 209 which indicates increasing temperature 208. Lower temperature line 210 and upper temperature line 212 may be plotted on graph 200. The lower temperature line 210 may indicate a lower limit in a traffic-to-temperature range 214. The upper temperature line 212 may indicate an upper limit in the traffic-to-temperature range 201.

Data points 214, 216 may be seen on the traffic-to-temperature graph 200. The data points may indicate a plurality of traffic-to-temperature parameters for a memory module over the course of a stress test. Data points 214 are positioned between the upper and lower traffic limits 206, 204, and between the upper and lower temperature limits 210, 212. These may indicate that for those data points, the memory module operated at the desired level of performance. Data point 216 however, is outside of the upper and lower traffic limits 204, 206. This may indicate that that the module did not receive sufficient traffic or that the module does not operate at the desired level of performance. The memory modules outside of the traffic-to-temperature range may need a different test configuration to generate stress on those modules. In an embodiment, each module may then be tested under a second stress test.

Figure 3:
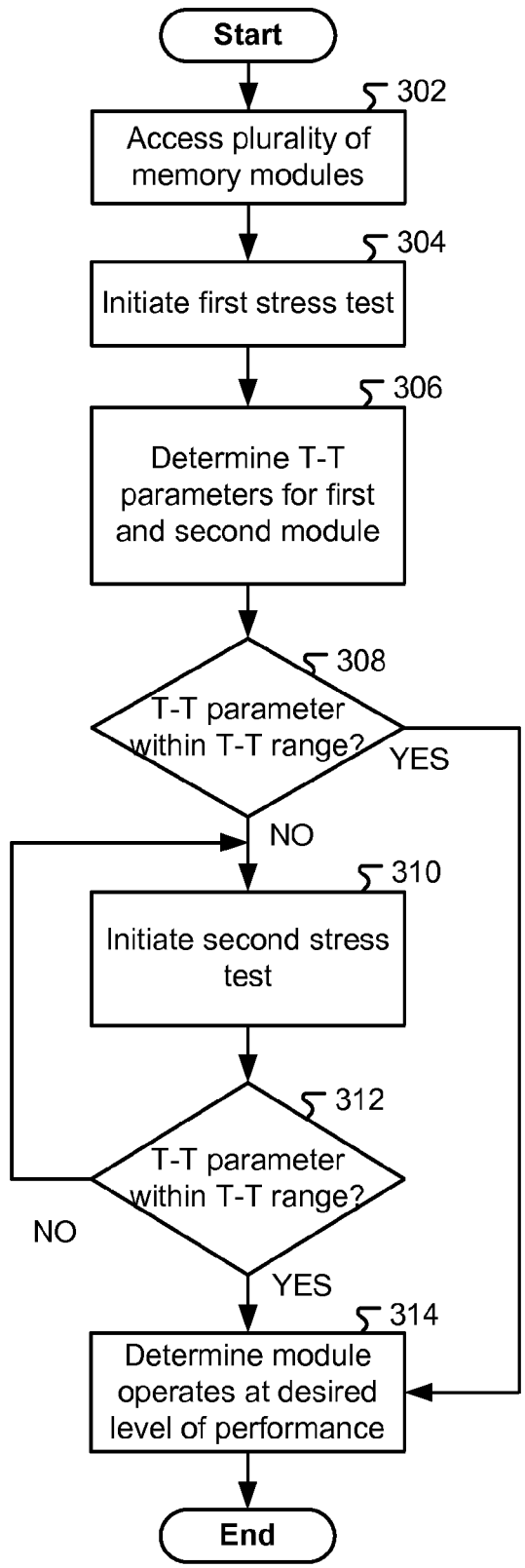
FIG. 3 depicts a flowchart of a method of memory module testing according to an embodiment.

Referring now to FIG. 3, a flowchart of a method of memory module testing may be seen. In operation 302, a plurality of memory modules may be accessed. The plurality of memory modules may be coupled in a computer system. The plurality of memory modules may include a first module having a first memory characteristic and a second module having a second memory characteristic. The first and second memory characteristics may be chosen as any suitable characteristic for computer memory. For example, the first and second memory characteristic may include capacity, memory type, memory protocol, single-drop configuration, and dual drop configuration, or other suitable memory characteristic. In an embodiment, the first module has a first characteristic of being a single-drop module and the second module has a second memory characteristic of being a dual-drop module. In another embodiment, the first module has a first memory characteristic of being a first capacity module and the second module has a second memory characteristic of being a second capacity. In an embodiment the first capacity may be greater than the second capacity.

In operation 304, a first stress test may be initialized. The first stress test may exercise the first and second modules with a pre-determined number of READ & WRITE commands (traffic). In an embodiment, the first stress test may generate a first level of traffic to the plurality of memory modules. However, other methods of stress testing may be used including increasing memory clock speeds, increasing voltage to the memory or other suitable stress test.

In operation 306, a traffic-to-temperature parameter for the first and second modules may be determined. The traffic-to-temperature parameters for the first and second modules may differ as the first stress test may present enough stress on one module, while at the same time one or more other memory modules may not undergo the same level of stress. The first module may have a first traffic-to-temperature parameter and the second module may have a second traffic-to-temperature parameter.

If the traffic-to-temperature parameter is within a traffic-to-temperature range then, in decision block 308, the method may progress to operation 314 and the module may be determined to operate at a desired level of performance. The traffic-to-temperature range for the first and second modules may be determined based on memory characteristics of the plurality of memory modules. For example, the first memory module may have a first traffic-to-temperature range based on the first memory characteristic. The second memory module may have a second traffic-to-temperature range based on the second memory characteristic. In an embodiment, the first traffic-to-temperature range may be based on the first capacity. The second traffic-to-temperature range may be based on the second capacity. If the traffic-to-temperature parameter for the first and second modules is within the traffic-to-temperature range. If the traffic-to-temperature parameter is outside the traffic-to-temperature range then, in decision block 308, the method may progress to operation 310.

In operation 310, a second stress test may be initialized. The second stress test may initiate a second level of traffic at the plurality of memory modules. The second stress test may exercise memory with a pre-determined number of READ & WRITE commands (traffic) to the plurality of memory modules. In an embodiment, where the first module has a first traffic-to-temperature parameter outside the first traffic-to-temperature range the second stress test may be initiated with the first module. In another embodiment, where the second module has a second traffic-to-temperature parameter outside the second traffic-to-temperature range the second stress test may be initiated with the first module. The second stress test may provide a different stress test configuration to the memory modules. In an embodiment, the second stress test may provide the second level of traffic received at the first module, the second level of traffic greater than the first level of traffic. However, other methods of stress testing may be used for the second stress test including increasing memory clock speeds, increasing voltage to the memory or other suitable stress test.

If the traffic-to-temperature parameter is within a traffic-to-temperature range then, in decision block 312, the method may progress to operation 314 and the modules may be determined to operate at the desired level of performance.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

We claim:

1. A system for verifying memory module functionality comprising:
   a plurality of memory modules coupled together, the plurality of memory modules including a first module having a first memory characteristic and a second module having a second memory characteristic;
   a memory controller, the memory controller configured to initiate a first stress test to the first and second modules; and
   a logic device, the logic device configured to measure a first traffic-to-temperature parameter for the first module and a second traffic-to-temperature parameter for the second module at the same time, the logic device configured to determine that the first module was sufficiently stressed in response to determining that that the first traffic-to-temperature parameter is within a first traffic-to-temperature range, and the logic device configured to determine that the second module was sufficiently stressed in response to determining that the second traffic-to-temperature parameter is within a second traffic-to-temperature range; and
   the memory controller is configured to initiate a second stress test to the first module in response to the logic device determining that the first traffic-to-temperature parameter is outside the first traffic-to-temperature range.

2. The system of claim 1, wherein:
   the logic device is configured to determine a third traffic-to-temperature parameter for the first module, and determining that the first module is sufficiently stressed in response to determining that a third traffic-to-temperature parameter is within the first traffic-to-temperature range.

3. The system of claim 2, wherein the first stress test provides a first level of traffic received at the plurality of memory modules and the second stress test provides a second level of traffic received at the first module, the second level of traffic greater than the first level of traffic.

4. The system of claim 1, wherein:
   the memory controller is configured to initiate a second stress test to the second module in response to the logic device determining that the second traffic-to-temperature parameter is outside the second traffic-to-temperature range; and
   the logic device is configured to determine a fourth traffic-to-temperature parameter for the second module, and determining that the second module is sufficiently stressed in response to determining that the fourth traffic-to-temperature parameter is within the second traffic-to-temperature range.

5. The system of claim 4, wherein the first stress test provides a first level of traffic received at the plurality of memory modules and the second stress test provides a second level of traffic received at the second module, the second level of traffic greater than the first level of traffic.

6. The system of claim 1, wherein the first memory characteristic is a single-drop module and the second memory characteristic is a dual-drop module.

7. The system of claim 1, wherein the first memory characteristic is a first capacity module and the second memory characteristic is a second capacity, the first capacity greater than the second capacity.

8. The system of claim 7, wherein the first traffic-to-temperature range is based on the first capacity and the second traffic-to-temperature range is based on the second capacity.

9. A computer program product for memory module testing, the computer program product comprising a computer readable storage medium having program instructions embodied therewith, the program instructions executable by a computer to cause the computer to perform a method comprising:
   accessing, with a first stress test, a plurality of memory modules, the plurality of memory modules coupled in a computer system, the plurality of memory modules including a first module having a first memory characteristic and a second module having a second memory characteristic;
   determining for the first module, a first traffic-to-temperature parameter, and determining that the first module was sufficiently stressed in response to determining that the first traffic-to-temperature parameter is within a first traffic-to-temperature range;
   determining, for the second module, a second traffic-to-temperature parameter, and determining that the second module was sufficiently stressed in response to determining that the second traffic-to-temperature parameter is within a second traffic-to-temperature range; and
   accessing the first memory module with a second stress test in response to determining that the first traffic-to-temperature parameter is outside the first traffic-to-temperature range.

10. The computer program product of claim 9, further comprising:
   determining a third traffic-to-temperature parameter for the first module, and determining that the first module is sufficiently stressed in response to determining that the third traffic-to-temperature parameter is within the first traffic-to-temperature range;
   wherein the first stress test provides a first level of traffic received at the plurality of memory modules and the second stress test provides a second level of traffic received at the first module, the second level of traffic greater than the first level of traffic.

11. The computer program product of claim 9, further comprising:
   accessing the second memory module with a second stress test in response to determining that the second traffic-to-temperature parameter is outside the second traffic-to-temperature range;
   determining a fourth traffic-to-temperature parameter for the second module, and determining that the second module is sufficiently stressed in response to determining that the fourth traffic-to-temperature parameter is within the second traffic-to-temperature range;
   wherein the first stress test provides a first level of traffic received at the plurality of memory modules and the second stress test provides a second level of traffic received at the second module, the second level of traffic greater than the first level of traffic.

12. The computer program product of claim 9, wherein the first memory characteristic is a first capacity module and the second memory characteristic is a second capacity, the first capacity greater than the second capacity.

* * * * *